United States Patent
Magnus et al.

(10) Patent No.: US 10,340,251 B2
(45) Date of Patent: Jul. 2, 2019

(54) METHOD FOR MAKING AN ELECTRONIC COMPONENT PACKAGE

(71) Applicant: NXP USA, INC., Austin, TX (US)

(72) Inventors: Alan J. Magnus, Gilbert, AZ (US); Jeffrey Lynn Weibrecht, Gilbert, AZ (US); Jason R. Wright, Chandler, AZ (US); Colby Greg Rampley, Phoenix, AZ (US)

(73) Assignee: NXP USA, Inc., Austin, TX (US)

( * ) Notice: Subject to any disclaimer, the term of this patent is extended or adjusted under 35 U.S.C. 154(b) by 86 days.

(21) Appl. No.: 15/497,259

(22) Filed: Apr. 26, 2017

(65) Prior Publication Data

US 2018/0315734 A1    Nov. 1, 2018

(51) Int. Cl.
*H01L 23/00* (2006.01)
*H01L 21/683* (2006.01)
(Continued)

(52) U.S. Cl.
CPC .......... *H01L 24/96* (2013.01); *H01L 21/2885* (2013.01); *H01L 21/6835* (2013.01); *H01L 24/11* (2013.01); *H01L 21/561* (2013.01); *H01L 21/568* (2013.01); *H01L 2221/68345* (2013.01); *H01L 2221/68359* (2013.01); *H01L 2221/68381* (2013.01); *H01L 2224/0239* (2013.01); *H01L 2224/02311* (2013.01); *H01L 2224/03462* (2013.01); *H01L 2224/0401* (2013.01); *H01L 2224/12105* (2013.01); *H01L 2224/13023* (2013.01); *H01L 2224/13024* (2013.01);
(Continued)

(58) Field of Classification Search
CPC ............... H01L 24/96; H01L 21/6835; H01L 2221/68359; H01L 2221/68381; H01L 21/561; H01L 2221/68345
See application file for complete search history.

(56) References Cited

U.S. PATENT DOCUMENTS 5,258,236 A   11/1993  Arjavalingam et al.
5,534,466 A   7/1996   Perfecto et al.
(Continued)

OTHER PUBLICATIONS

Ma, M., et al., "The development and the integration of the 5ġμm to 1ġμm half pitches wafer level Cu redistribution layers", 2016 IEEE 66th Electronic Components and Technology Conference.
(Continued)

*Primary Examiner* — Marcos D. Pizarro
*Assistant Examiner* — Antonio B Crite
(74) *Attorney, Agent, or Firm* — Charlene R. Jacobsen (57) ABSTRACT

In making electronic component packages, a method includes forming a sacrificial material over a first temporary substrate, applying a second temporary substrate to the sacrificial material, and then curing the sacrificial material. After curing, the second temporary substrate is removed. The top surface of the sacrificial layer is defined by the second temporary substrate. After removal, a redistribution structure is formed on the top surface. After the formation of the redistribution structure, electronic components are applied to the redistribution structure. The electronic components are encapsulated to form an encapsulated panel. The first temporary substrate and the sacrificial material are removed. The panel is singulated into multiple electronic component packages.

18 Claims, 9 Drawing Sheets

(51) Int. Cl.
  *H01L 21/288*  (2006.01)
  *H01L 21/56*  (2006.01)

(52) U.S. Cl.
  CPC ............... *H01L 2924/01022* (2013.01); *H01L 2924/01029* (2013.01); *H01L 2924/07025* (2013.01); *H01L 2924/2064* (2013.01)

(56) References Cited

U.S. PATENT DOCUMENTS

| | | | |
|---|---|---|---|
| 7,883,991 | B1 | 2/2011 | Wu et al. |
| 8,987,602 | B2 | 3/2015 | Hurwitz et al. |
| 2007/0281471 | A1 | 12/2007 | Hurwitz et al. |
| 2009/0321932 | A1 | 12/2009 | Gonzalez et al. |
| 2011/0024173 | A1 | 2/2011 | Wu et al. |
| 2012/0205838 | A1* | 8/2012 | Washiya ................. B82Y 10/00 264/447 |
| 2013/0199732 | A1* | 8/2013 | Niwa ......................... C09J 5/06 156/712 |
| 2014/0020945 | A1 | 1/2014 | Hurwitz et al. |
| 2015/0333004 | A1 | 11/2015 | Jomaa et al. |
| 2016/0307870 | A1 | 10/2016 | Kelly et al. |
| 2018/0151546 | A1* | 5/2018 | Lin ....................... H01L 25/117 |

OTHER PUBLICATIONS https://www.a-star.edu.sg/Portals/30/Users/139/39/139/IME's%20HD%20FO-WLP%20Consortium%20Project-Fabrication-22%20Apr%2014.pdf; "Fabrication: Mold-First & RDL-First Approach for High-Density FO-WLP"; Institute of Microelectronics, Apr. 22, 2014.

Liu, F., "Next Generation Panel-Scale RDL with Ultra Small Photo Vias and Ultra-fine Embedded Trenches for Low Cost 2.5D Interposers and High Density Fan-Out WLPs", 2016 IEEE 66th Electronic Components and Technology Conference.

Huemoeller, R., "Silicon wafer integrated fan-out technology", Amkor Technology, Inc., Chip Scale Review, Mar.-Apr. 2015.

Landesberger, C., "Carrier techniques for thin wafer processing", CS MANTECH Conference, Austin, TX, USA, May 14-17, 2007.

Hermanowski, J., "Thin wafer handling—Study of temporary wafer bonding materials and processes", IEEE International Conference on 3D System Integration, Sep. 28-30, 2009.

* cited by examiner

METHOD FOR MAKING AN ELECTRONIC COMPONENT PACKAGE

BACKGROUND OF THE INVENTION

Field of the Invention

This invention relates to a method for making an electronic component package.

Description of the Related Art

An electronic component package includes one or more electronic components such as a semiconductor die or a standalone electronic component encapsulated in an encapsulant that allows the components to be used in a system (e.g. an electronic system such as a computer, phone, laptop, or other system utilizing a device such as an automobile, appliance, robotic equipment etc.). The package may include external terminals (e.g. leads, pads, bumps) for providing communication signal lines and power to the components.

Some electronic component packages are formed by a "chips last" packaging process such as a Chips Last Fan-Out Wafer Level Packaging process. In a chips last process, a redistribution structure is first formed over a substrate. Electronic components are then attached to the redistribution structure and subsequently encapsulated to form and encapsulated panel. After the substrate is removed, the panel is singulated into multiple electronic component packages.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

In a process for making electronic component packages, a method includes forming a sacrificial material over a first temporary substrate, applying a second temporary substrate to the sacrificial material, and then curing the sacrificial material. After curing, the second temporary substrate is removed. The top surface of the sacrificial layer is defined by a surface of the second temporary substrate. After removal, a redistribution structure is formed on the top surface. After the formation of the redistribution structure, electronic components are applied to the redistribution structure. The electronic components are encapsulated to form an encapsulated panel. After the first temporary substrate and sacrificial material are removed from the encapsulated panel, the panel is singulated into multiple electronic component packages.

In one embodiment, providing a process for forming an electronic component package that includes applying a second temporary substrate to the sacrificial material prior to curing to define the top surface of the sacrificial material may allow for a process that provides a smoother surface for the formation of the redistribution structure. In some embodiments, due to the properties of the sacrificial material, the second temporary substrate can be easily removed from the cured temporary material to provide a planar surface with minimal defects on which a layer for a redistribution structure can be formed.

Figure 1:
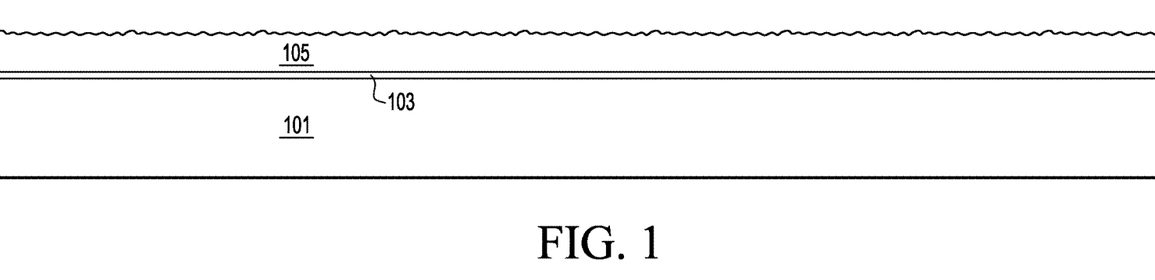
FIGS. 1-9 set forth cutaway side views of various stages in the formation of an electronic component package according to one embodiment of the present invention.

FIG. 1 is a cut away side view showing a stage in the manufacture of an electronic component package according to one embodiment of the present invention. A layer 105 of uncured adhesive is applied to a carrier 101 coated with a layer 103. In one embodiment, carrier 101 is a glass carrier having a thickness in the range of 500 to 900 microns (e.g. 700 microns) and has a disk shape. However, in other embodiments, carrier 101 may be another type of substrate (e.g. ceramic), may be made of other types of materials, may be of other thicknesses, and/or may have other shapes.

In one embodiment, layer 103 is made of a light to heat material that is 2 microns thick. In one embodiment, the material of layer 103 includes an acrylic resin with a carbon black filler. The material of layer 103 allows for the conversion of laser radiation to heat by utilizing the carbon black as a black body absorber. However in other embodiments, layer 103 may be another type of material and/or be of another thickness. In one embodiment, layer 103 is coated on carrier 101 by a spin on process, but may be applied by other methods in other embodiments.

After layer 103 is coated onto carrier 101, layer 105 is applied to layer 103. In one embodiment, layer 105 is applied by a spin on process, but maybe applied by other methods in other embodiments. In one embodiment, layer 105 is a UV curable, acrylic type resin that is applied in an uncured state. In some embodiments, the material of layer 105 has a has a rapid cure time, poor adhesion characteristics to a smooth surface, low outgassing characteristics under high vacuum, and can withstand >200° C. processing temperatures post cure. In one embodiment, the material of layer 105 is sold under the trade designation of LC-5320 by 3M™. In one embodiment, layer 105 has a thickness in the range of 30-70 microns (e.g. 50 microns), but may have other thicknesses in other embodiments. Accordingly, the thickness of carrier 101 and the thickness of layer 105 shown in FIG. 1 may not be proportional for all embodiments. In one embodiment, as applied in the uncured state as shown in FIG. 1, layer 105 has a relatively rough (e.g. orange peel) type surface. Thus, in some embodiments, the relatively rough surface of layer 105 would not meet planarity requirements for the subsequent formation of a redistribution structure. Layer 105 may be made of other materials in other embodiments, such as, for example, modified acrylates, modified epoxies, or high temperature thermoplastics.

Figure 2:
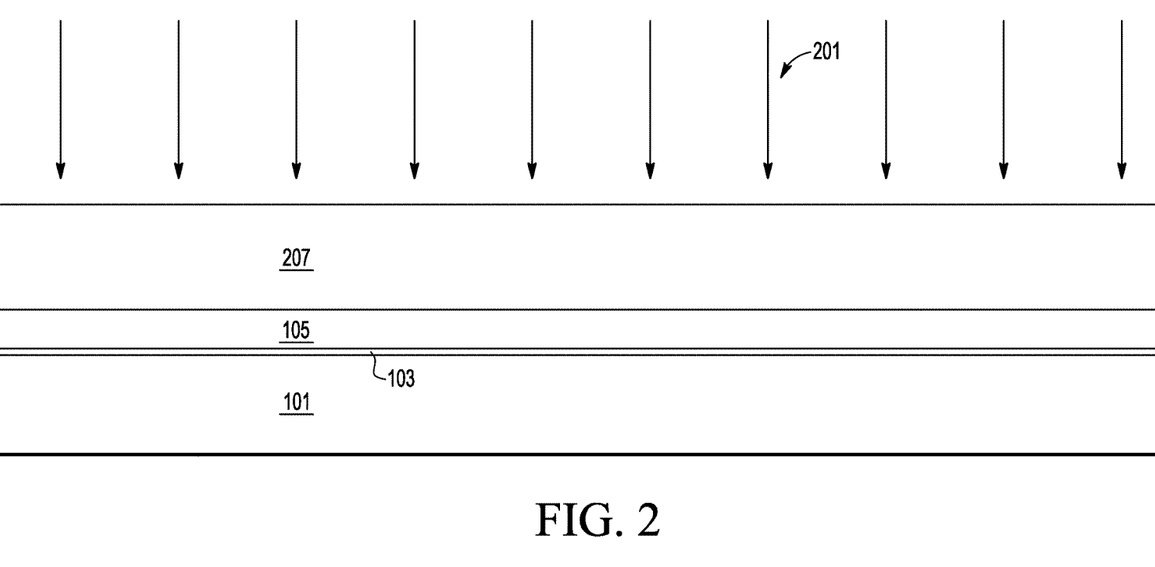

FIG. 2 shows a stage in manufacture after a carrier 207 is applied to the top surface of layer 105 and layer 105 is being cured with UV radiation 201 by exposure through the glass of carrier 207 for a predetermined amount of time (e.g. 45 seconds in one embodiment). In one embodiment, carrier 207 is a glass carrier that is similar to carrier 101, but may be a different type of substrate in other embodiments. In FIG. 2, carrier 207 is pressed on layer 105 at a pressure in the range of 0.10 MPa-0.18 MPa (e.g. 0.14 MPa), but may be pressed on at other pressures in other embodiments. In one embodiment, layer 105 can be cured by heat at a temperature such as 150° C. for 30 minutes, but may be cured at other temperatures and/or for other times in other embodiments. In another embodiment, layer 103 is cured by UV radiation though carrier 101. With such an embodiment, carrier 207 can be made of a material that is not transparent to UV radiation. In still other embodiments, layer 105 can be cured by other methods.

Figure 3:
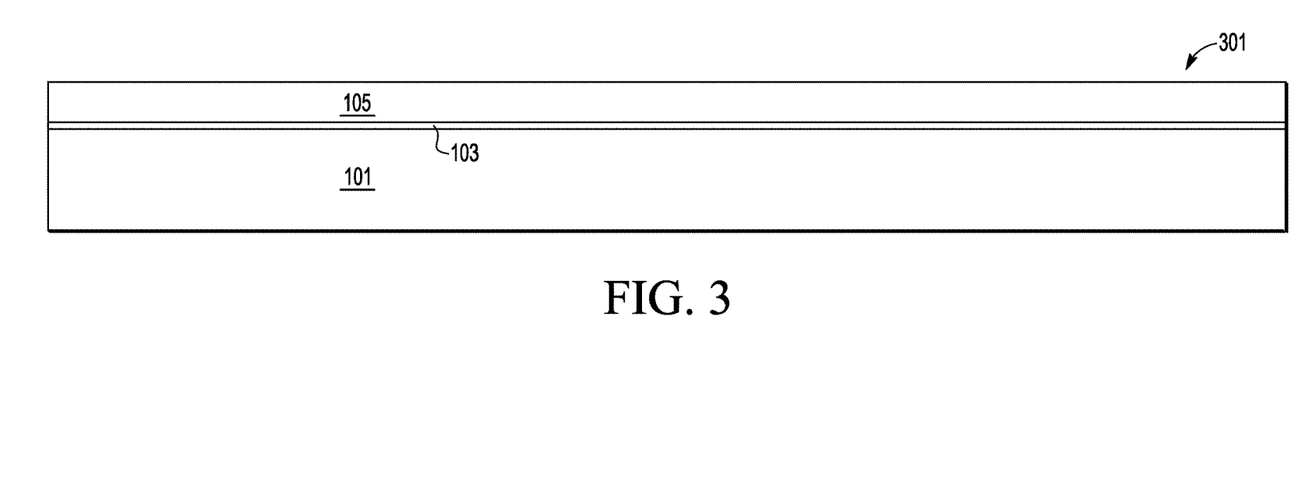

FIG. 3 shows a cutaway side view after layer 105 has been cured and carrier 207 has been removed. In one embodiment, due the properties of cured layer 105, carrier 207 is removed by a relatively low amount of mechanical force between layer 105 and carrier 207. In one embodiment, the cured adhesive peel strength of layer 105 to carrier 207 is 0.5N/25 mm or less. However, the cured adhesive peel strength may be of other values in other embodiments.

Cured layer 105 has a top surface 301 that is defined by the bottom surface of carrier 207 (relative to the view of FIG. 2). Because the bottom surface of carrier 207 is relatively planar, surface 301 is also relatively planar. In one embodiment, surface 301 has a roughness (Ra) of 1 nm or less and total thickness variation (TTV) of 2 um or less, but may have other roughnesses (Ra) and/or other total thickness variations (TTV) in other embodiments.

Utilizing a layer of curable adhesive with a low adhesion to flat surface characteristics and utilizing a second substrate (e.g. carrier 207) may in some embodiments, enable a method that provides for an adhesive surface that has a relatively planar surface 301 and that can be separated easily from the second substrate with minimal damage to the surface (301).

Providing a relatively planar surface to form layers of a redistribution structure may allow for those first formed layers to have a reduced thickness. Otherwise, if the surface 301 of the adhesive layer 105 is rougher, then the first formed layers of the redistribution structure may have to be made thicker to account for the non planar aspects of the base surface (301).

Furthermore, curing layer 105 with carrier 207 applied thereto may, in some embodiments, advantageously allow for layer 105 to be cured in an oxygen free environment with minimal defects.

Also in some embodiments, carrier 207 can advantageously remain on layer 105 after curing until the formation of a subsequent layer (e.g. layer 401 of FIG. 4), thereby providing protection for layer 105 during storage and transport.

Figure 4:
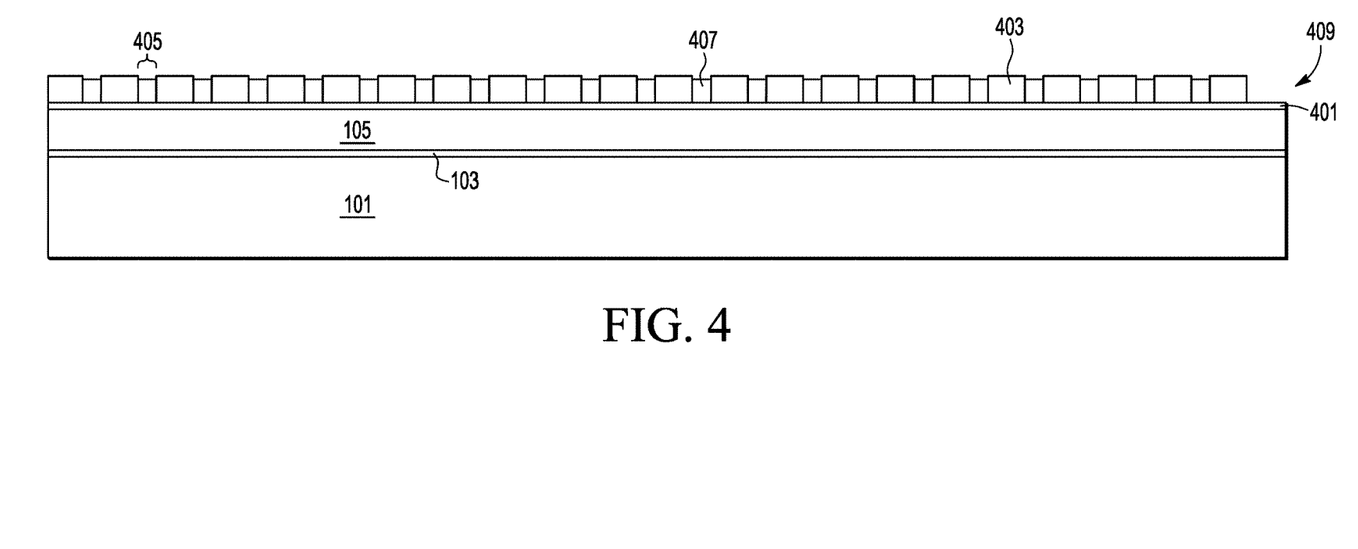

FIG. 4 shows a cutaway side view of a stage after layers of a redistribution structure are formed on cured layer 105. In one embodiment, layer 401 is a metal layer that will act as a seed layer for the subsequent formation of contacts by electroplating. In one embodiment, layer 401 is a bi-metal layer made of an initially formed titanium layer and a subsequently formed copper layer. Layer 401 has a thickness in the range of 0.2-1.0 microns. However in other embodiments, layer 401 is made of other materials and/or is of other thickness. In one embodiment, layer 401 is formed by a sputtering process, but may be formed by other processes (e.g. CVD, PECVD) in other embodiments.

Afterwards, a layer 403 of dielectric material is deposited on layer 401. In one embodiment, layer 403 is made of polyimide and is applied using a spin-on process, but may be made of other dielectric materials such as Polybenzoxazoles (PBO) or epoxy based materials and/or formed by other processes in other embodiments. In one embodiment, layer 403 has a thickness in the range of 3-8 microns (e.g. 7 microns), but may be of other thicknesses in other embodiments. In one embodiment, the thickness of layer 403 will define the thickness of subsequently formed contact pads 407.

Layer 403 is patterned with a photolithographic process to form a number of openings 405 which will subsequently be used to form contact pads 407. In one embodiment, the width of the openings 405 is in the range of 200-350 um, but may be of other widths in other embodiments. In one embodiment, the width is determined by the desired width of the subsequently formed contact pads. Also, during the patterning, a portion of layer 403 is removed at edge area 409.

Contacts pads 407 are formed by electroplating conductive material (e.g. copper) from seed layer 401 to at least partially fill openings 405. In one embodiment, an electrode (not shown) is attached to layer 401 at area 409 for electroplating. In other embodiments, the contact pads 407 can be formed of other materials and/or formed by other processes. In the embodiment shown, the plating of the conductive material of contact pads 407 is controlled such that the conductive material is plated to a height just to below the top surface of layer 403. In other embodiments, the conductive material is plated to above the top surface of layer 403, where the conductive material can be planarized down to the top surface of layer 403. In other embodiments where the conductive material of contact pads 407 are plated above layer 403, the conductive material above layer 403 can be planarized and patterned to form a first interconnect layer. (See layer 501).

Figure 5:
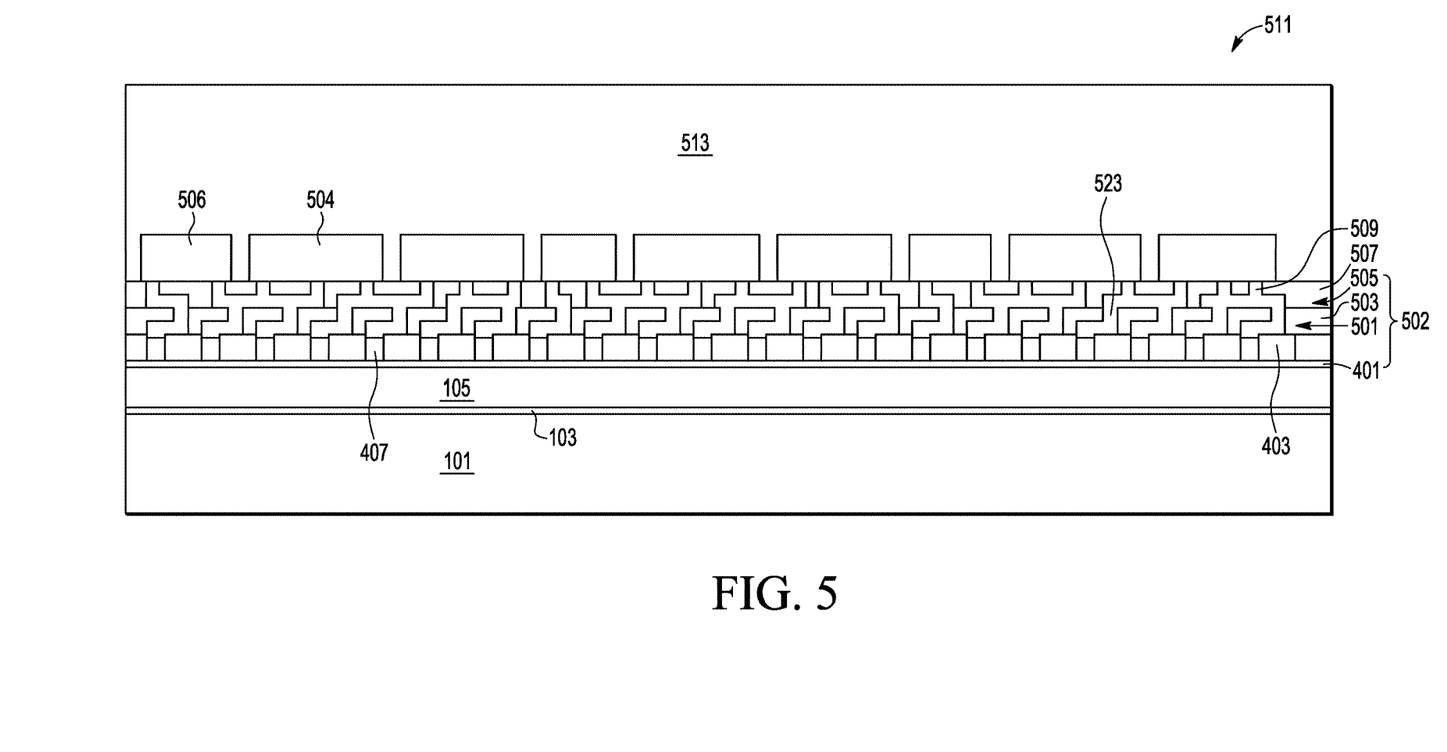

FIG. 5 shows a cutaway side view after redistribution structure 502 is completed, electronic components (504, 506) have been attached to structure 502, and the components (504, 506) are encapsulated with encapsulant 513 to form panel 511. In the embodiment shown, redistribution structure 502 includes two redistribution layers 501 and 505 that include metal interconnects for interconnecting the contact pads 407 with the component pads 509. In one embodiment, interconnect layers 501 and 505 are each formed by forming a layer of patterned conductive material (e.g. copper) and then forming a thicker layer (503 and 507) of photo definable dielectric material over the layer of patterned conductive material. In one embodiment, each layer of patterned conductive material is formed by forming a blanket seed layer over the preceding layer, forming a layer of resist (not shown) over the seed layer, patterning the layer of resist, electroplating the seed layer to form contact material in the openings of the resist, stripping the resist, and removing the unplated seed layer. In one embodiment, the interconnect layers 501 and 505 each have a thickness in the range of 3-5 um, but may have other thicknesses in other embodiments. In one embodiment, layers 503 and 507 are made of polyimide and each have a thickness in the range of 7-13 microns, but may have other thicknesses and/or be made of other materials in other embodiments.

After each of layers 503 and 507 are formed, they are then patterned to form openings to the conductive structures of the previously formed redistribution layers (501 or 505). The openings in layer 503 are used to form conductive vias (523) and the openings in layer 507 are used to form component pads (509). Those openings are filled with a conductive material (e.g. copper) to form the conductive structures. In one embodiment, those openings are filled with conductive material by an electroplating process to a level just below the top surface of the dielectric layer (507, 509) (e.g. 1 micron below). However, in other embodiments, the openings can be filled to the top surface of the dielectric layer or to a level above the top surface of the dielectric layer and then planarized to the top surface of the dielectric layer.

Redistribution structure 502 can have other configurations, be formed by other processes, have other structures, and/or be formed of other materials in other embodiments. For example, the redistribution layers 501 and 505 can be formed by first depositing a dielectric layer (503), forming openings in the dielectric layer, and then depositing a metal layer (e.g. aluminum, gold) in the openings to form the redistribution structures of a redistribution layer (e.g. 501). Also in other embodiments, redistribution structure 502 may include a different number of redistribution layers (e.g. one or greater than two). Furthermore, the thicknesses of the redistribution layers and the intervening dielectric layers (e.g. 503, 507) may be different from each other with respect to each layer.

After the completion of structure 502, electronic components (504, 506) are attached to redistribution structure 502. Components (504, 506) include conductive structures (e.g. pads, bumps—not shown) on the bottom sides relative to the view shown in FIG. 5. In one embodiment, those conductive structures are attached with solder or conductive adhesive to the component pads (509) of redistribution structure 502. Electronic components (504, 506) can be any one of a number of electronic components such as a semiconductor die or a standalone component such as a standalone capacitor, inductor, resistor, diode, or sensors etc.

Figure 6:
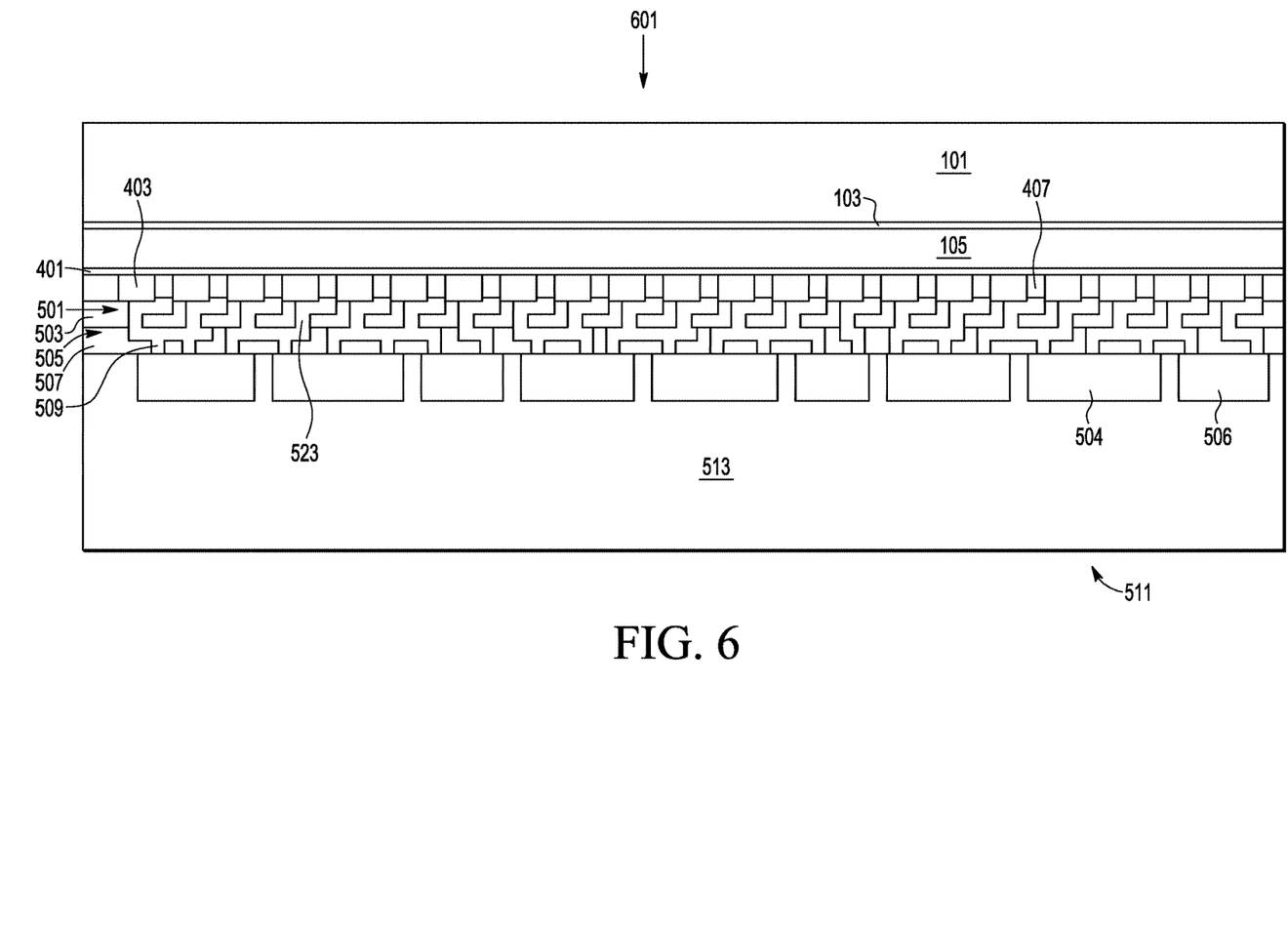

FIG. 6 shows a stage after panel 511 is inverted and layer 103 is subjected to laser ablation 601 through carrier 101 to degrade adhesive layer 103 for the subsequent removal of carrier 101. In other embodiments, layer 103 can be removed by other processes.

Figure 7:
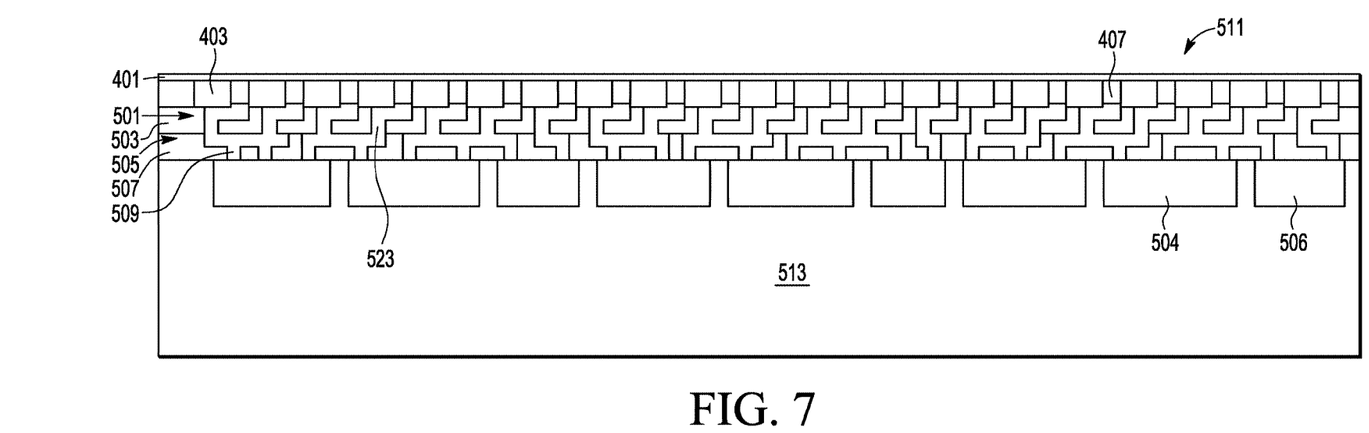

FIG. 7 shows a cut away side view of panel 511 after layer 105 is removed and any remaining portions of layer 103 are removed. In one embodiment, layer 105 is removed using a tape peel method, but may be removed by other processes in other embodiments (e.g. planarization, or solvent).

Figure 8:
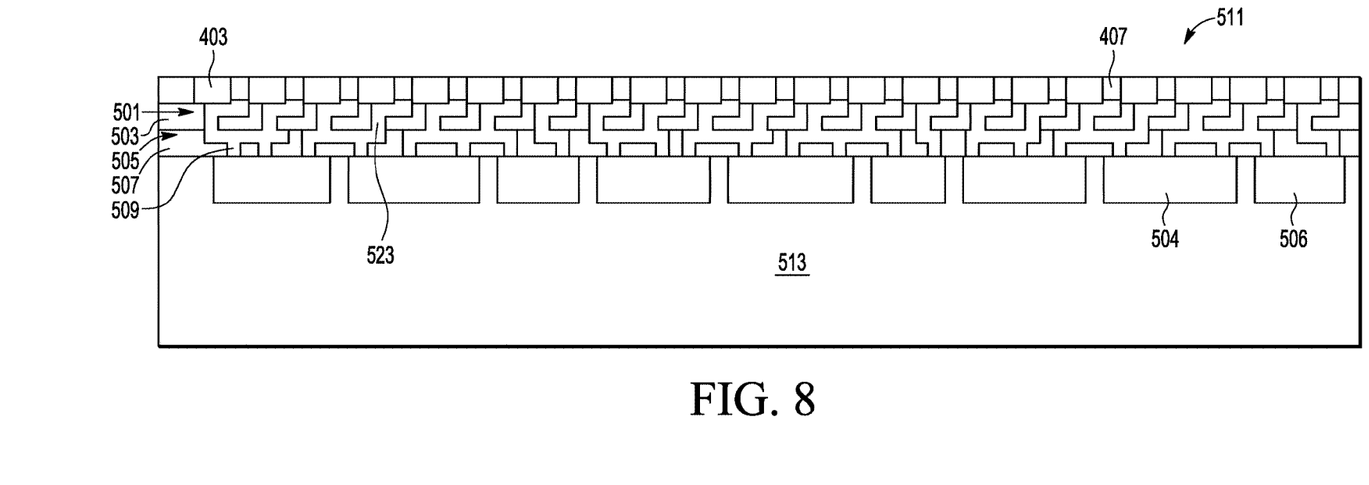

FIG. 8 shows panel 511 after the removal of seed layer 401 from panel 511. In one embodiment, layer 401 is removed by etching, but may be removed by other processes such as by a planarization process in other embodiments. Contact pads 407 are exposed as a result of the removal.

Figure 9:
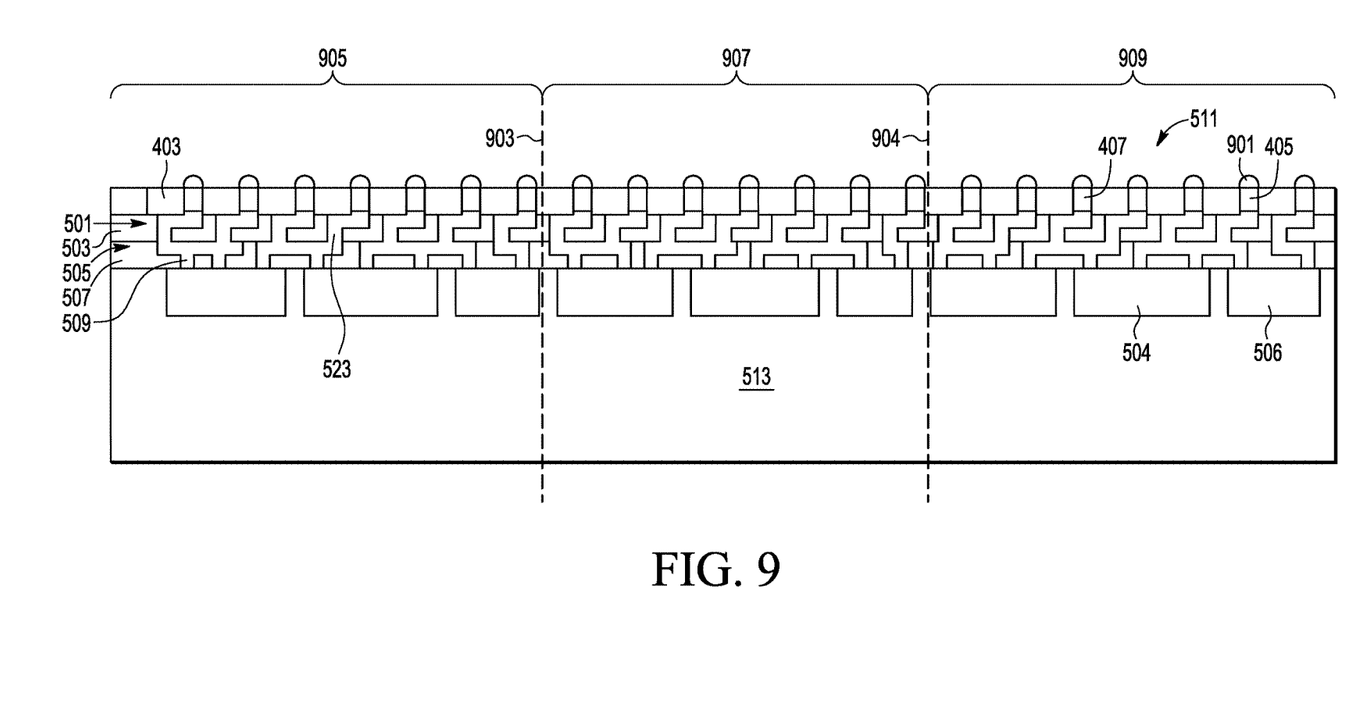

FIG. 9 shows a cut away side view of panel 511 after the attachment of solder balls (901) to the contact pads (407). In other embodiments, other types of external conductors (e.g. pads, bumps) may be attached to the pads (407). In still other embodiments, layer 403 may be partially etched to partially expose the sides of pads 407 such that pads 407 serve as the external connectors for the electronic component packages (e.g. where solder balls are not utilized).

FIG. 9 shows singulation lines 903 and 904 where panel 511 is subsequently singulated to form electronic component packages 905, 907, and 909. Panel 511 can be singulated by a saw, laser, or other singulation method. Although three electronic component packages 905, 907, and 909 are shown in FIG. 9, other panels in other embodiments may be singulated into a different number of electronic component packages (e.g. 50).

After singulation, the electronic component packages can be sent to system manufactures to be implemented with other electronic components in different types of systems (e.g. computer systems, cell phones, tablets, appliances, automobiles). In one embodiment, the packages are implemented in the systems by attaching the packages to circuit boards (not shown) of the systems.

In some embodiments, applying a second temporary substrate (e.g. carrier 207) to sacrificial material (e.g. layer 105) prior to curing to define the top surface (e.g. 301) of the sacrificial material may allow for a process that provides a smooth surface for the formation of a redistribution structure (502). For example, because top surface 301 is relatively planar, seed layer 401 and pads 407 can be made thinner (e.g. 3-8 microns) in that they do not have to be thicker to accommodate for variances in the planarity of surface 301.

Figure 10:
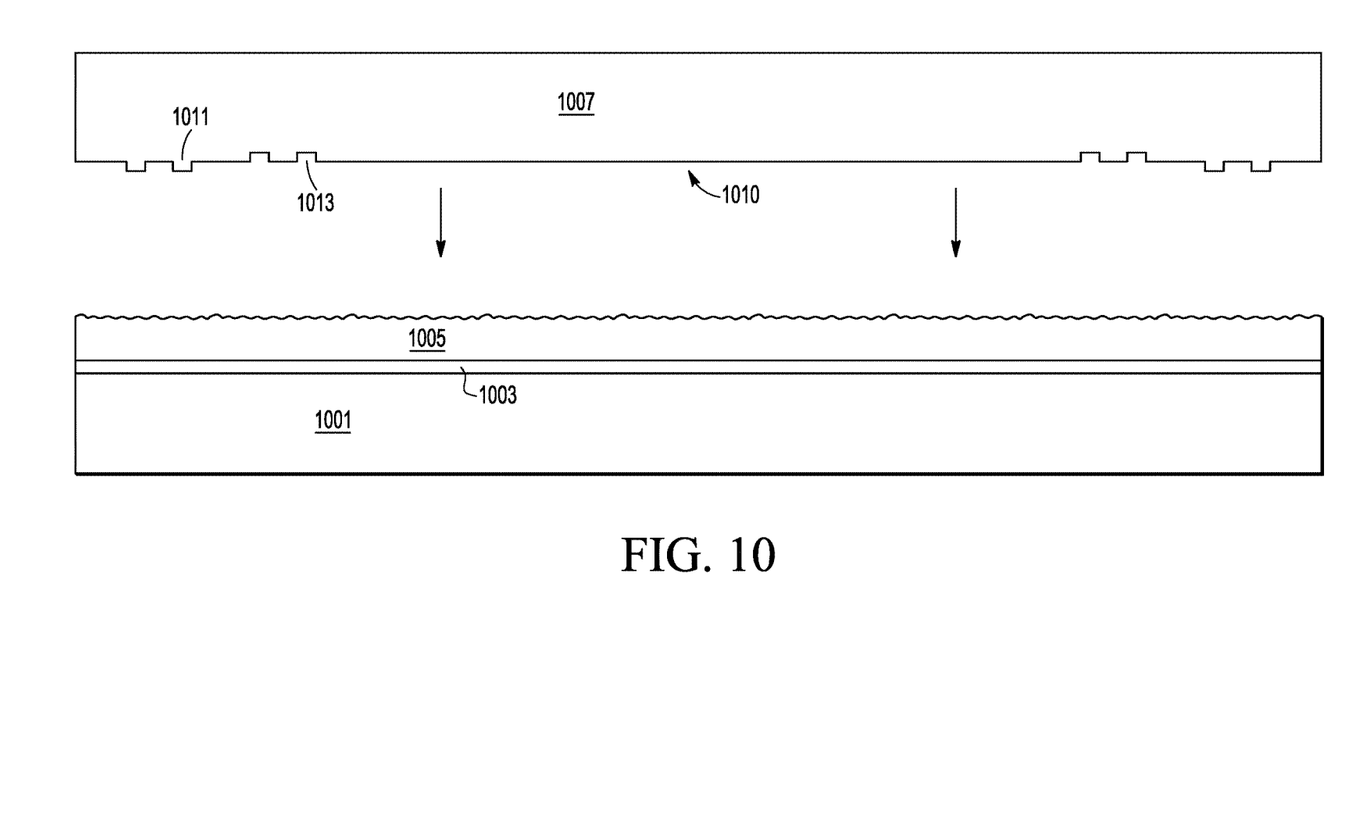
FIGS. 10-13 set forth cutaway side views of various stages in the formation of an electronic component package according to another embodiment of the present invention.

FIG. 10 shows a cutaway side view at a stage in the manufacture of an electronic component package according to another embodiment of the present invention. A layer 1005 of uncured adhesive is applied to a carrier 1001 with a layer 1003 of adhesive. In one embodiment, layer 1005, layer 1003, and carrier 1001 are similar to layer 105, layer 103, and carrier 101, respectively.

At the stage of FIG. 10, a carrier 1007 is being brought towards layer 1005. Unlike carrier 207, the bottom side (relative to the view shown in FIG. 10) of carrier 1007 includes several features that have been formed on planar surface 1010. For example, carrier 1007 includes recesses 1013 and extensions 1011. In one embodiment, the extensions and recesses are formed by the selective etching of carrier 1007. In other embodiments, the extensions (1011) may be added to carrier 1007 after the etching of recesses 1013. In one embodiment, the recesses have a depth from the planar surface in the range of 2-10 um, but may have other depths (e.g. 10-40 um) in other embodiments. In one embodiment, extensions 1011 have a height from the planar surface in the range of 2-10 um, but may have other heights (10-40 um) in other embodiments. In some embodiments, a carrier has recesses (1013) and no extensions and in other embodiments, a carrier has extensions (1011) and no recesses.

Figure 11:
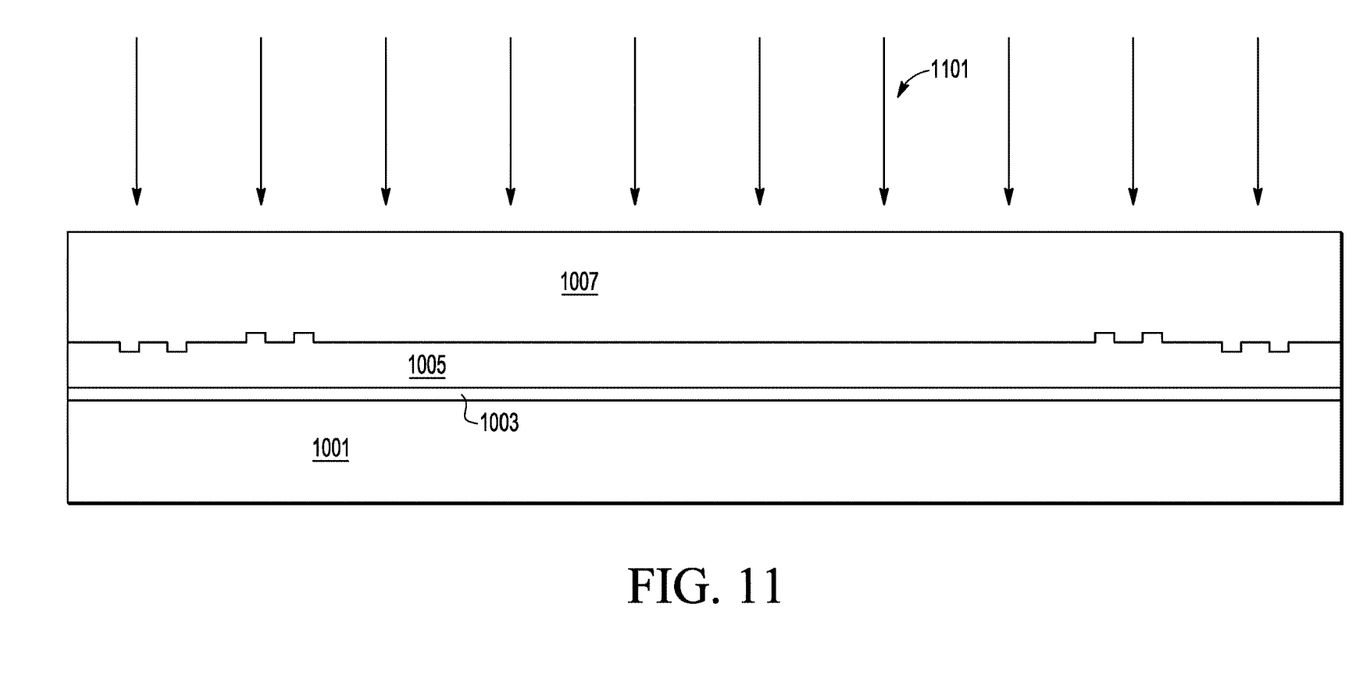

FIG. 11 shows where carrier 1007 is in contact with layer 1005 and UV radiation 1101 is being applied through glass carrier 1007 to cure layer 1005.

Figure 12:
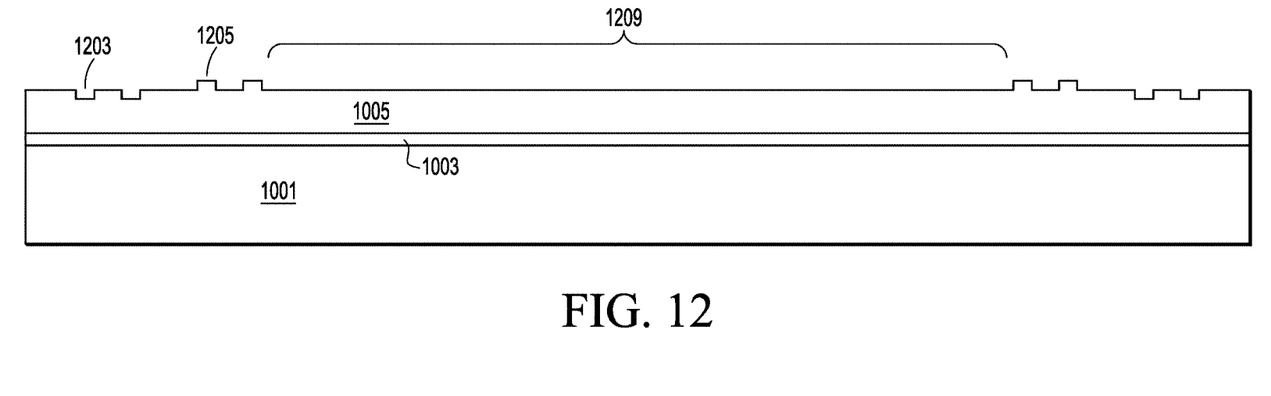

FIG. 12 shows where carrier 1007 has been removed from layer 1005 after layer 1005 has been cured. As shown in FIG. 12, the extensions 1011 in carrier 1007 form corresponding recesses 1203 in layer 1005. The recesses 1013 in carrier 1007 form corresponding extensions 1205 in layer 1005. After the curing, layer 1005 includes an unfeatured area 1209 that in one embodiment, has a roughness (Ra) of 1 nm or less. If a carrier were to have no features, then the entire surface of layer 1005 would be an unfeatured area.

Figure 13:
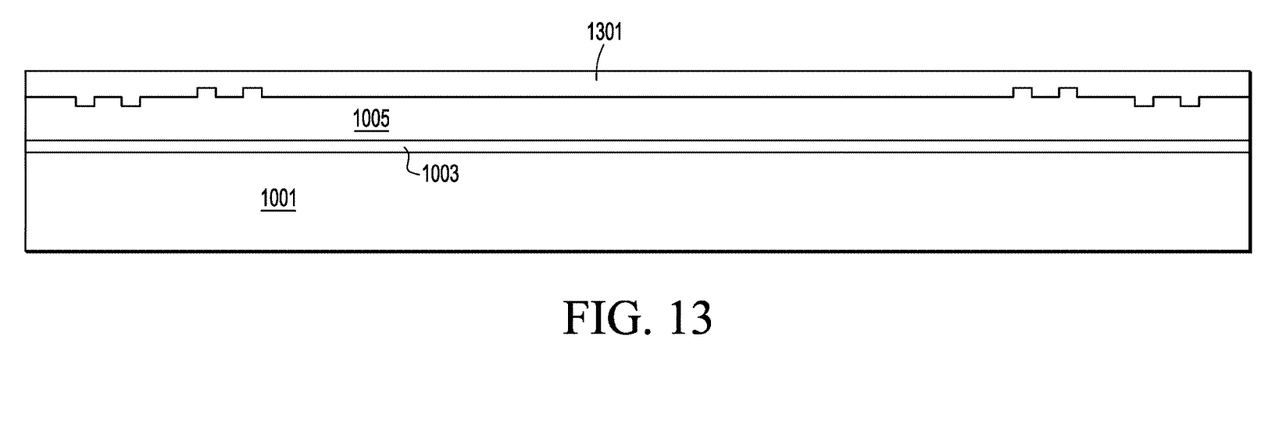

FIG. 13 is a cutaway side view of a stage after a non conformal dielectric layer 1301 is formed on layer 1005. Layer 1301 will be part of a redistribution structure (not shown) that will be subsequently formed. In one embodiment, layer 1301 has a thickness in the range of 3-12 microns and is made of polyimide, but may have other thicknesses and/or made of other materials in other embodiments. Layer 1301 will subsequently be pattern to form openings for the deposition of a conductor material for the formation of contact pads (not shown). In one embodiment, the patterning of layer 1301 will be formed before the next layer is formed on layer 1301. In other embodiments, layer 1301 will be patterned after layer 1005 is removed.

Because layer 1301 encapsulates recesses 1203 and extensions 1205, layer 1301 also includes corresponding features in its bottom surface. These features in layer 1301 can serve as identification markings for subsequently built panels or electronic component packages. In other embodiments, these features can also be used to make conductive features such as bond pads or interconnects. For example, if layer 1301 were a conductive layer, the conductive material formed in recesses 1203 could form bond pads after a planarization of layer 1301, leaving only the conductive material in recesses 1203. In other embodiments, layer 1301 may be a conductive seed layer similar to layer 401. In still other embodiments, layer 1301 may be a conformal layer.

After the formation of layer 1301, other dielectric and conductive layers maybe formed over layer 1005 to form structures of a redistribution structure (not shown). Afterwards, electronic components are attached and encapsulated to form an encapsulated panel (not shown). Solder balls can be attached and the panel singulated into individual electronic components.

In one embodiment, a method of making an electronic component package includes applying a sacrificial material to a first temporary substrate, applying a second temporary substrate to a top side of the sacrificial material, curing the sacrificial material while the second temporary substrate is applied to the top side, and after the curing, removing the second temporary substrate from the sacrificial material. The top side has a top surface defined by the second temporary substrate. The method includes after the removing, forming a redistribution structure over the top side of the sacrificial material. The redistribution structure includes at least one redistribution layer. The method includes attaching a plurality of electronic components to the redistribution structure and after the attaching, encapsulating the plurality of electronic components to form an encapsulated panel that includes the redistribution structure. The method includes removing the first temporary substrate and the sacrificial material from the encapsulated panel after the encapsulating and singulating the encapsulated panel into a plurality of electronic component packages. Each electronic component package of the plurality includes a at least one electronic component of the plurality of electronic components.

In another embodiment, a method of making an electronic component package includes applying a sacrificial material to a first glass carrier, applying a second glass carrier to a top side of the sacrificial material, curing the sacrificial material with UV radiation through the second glass carrier while the second glass carrier is applied to the top side, and after the curing, removing the second glass carrier from the sacrificial material. The top side has a top surface defined by the second glass carrier. The method includes after the removing, forming a redistribution structure over the top side of the sacrificial material. The redistribution structure including at least one redistribution layer. The method further includes attaching a plurality of electronic components to the redistribution structure, and after the attaching, encapsulating the plurality of electronic components to form an encapsulated panel that includes the redistribution structure. The method includes removing the first glass carrier and the sacrificial material from the encapsulated panel after the encapsulating and singulating the encapsulated panel into a plurality of electronic component packages. Each electronic component package of the plurality of electronic component packages includes at least one electronic component of the plurality of electronic components.

Features shown or described with respect to one embodiment may be implemented with other embodiments shown or described herein. While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method of making an electronic component package, the method comprising:
    applying a sacrificial material to a first temporary substrate;
    applying a second temporary substrate to a top side of the sacrificial material;
    curing the sacrificial material while the second temporary substrate is applied to the top side, wherein a cured adhesive peel strength of the sacrificial material to the second temporary substrate is 0.5N/25 mm or less;
    after the curing, removing the second temporary substrate from the sacrificial material, wherein the top side has a top surface defined by the second temporary substrate;
    after the removing, forming a redistribution structure over the top side of the sacrificial material, the redistribution structure including at least one redistribution layer;
    attaching a plurality of electronic components to the redistribution structure;
    after the attaching, encapsulating the plurality of electronic components to form an encapsulated panel that includes the redistribution structure;
    removing the first temporary substrate and the sacrificial material from the encapsulated panel after the encapsulating; and
    singulating the encapsulated panel into a plurality of electronic component packages, each electronic component package of the plurality including at least one electronic component of the plurality of electronic components.

2. The method of claim 1 wherein the forming the redistribution structure includes forming a first layer on the top surface, wherein the first layer has a thickness in the range of 0.2-8 microns.

3. The method of claim 1 wherein the forming the redistribution structure includes forming a metal seed layer on the top surface.

4. The method of claim 1 further comprising:
    after the removing the first temporary substrate and the sacrificial material and before the singulating, attaching a plurality of solder balls to the encapsulated panel, wherein each electronic component package of the plurality of electronic component packages includes at least one solder ball of the plurality of solder balls.

5. The method of claim 1 wherein the curing includes curing the sacrificial material with UV radiation that is applied through the second temporary substrate.

6. The method of claim 1 wherein the first temporary substrate and the second temporary substrate are both made of a glass material.

7. The method of claim 1 wherein the second temporary substrate has a first side having a planar surface with at least one recess in the planar surface, wherein the top side of the sacrificial material has a top surface defined by the first side of the second temporary substrate after the curing, and the at least one recess forms at least one corresponding extension structure on the top side as a result of the curing.

8. The method of claim 1 wherein the second temporary substrate has a first side having a planar surface with at least one extension from the planar surface, wherein the top side of the sacrificial material has a top surface defined by the first side of the second temporary substrate after the curing, and the at least one extension forms at least one corresponding recess in the top side as a result of the curing.

9. The method of claim 1 wherein the sacrificial material is characterized as a UV curable resin.

10. The method of claim 1 wherein prior to applying a sacrificial material to a first temporary substrate, the method includes applying a layer of light to heat conversion adhesive to a first side of the first temporary substrate, wherein the sacrificial material is applied on the layer of light to heat conversion adhesive.

11. The method of claim 10 wherein the removing the first temporary substrate and the sacrificial material from the encapsulated panel includes laser ablating the layer of light to heat adhesive through the first temporary substrate.

12. A method of making an electronic component package, the method comprising:
applying a sacrificial material to a first temporary substrate;
applying a second temporary substrate to a top side of the sacrificial material;
curing the sacrificial material while the second temporary substrate is applied to the top side;
after the curing, removing the second temporary substrate from the sacrificial material, wherein the top side has a top surface defined by the second temporary substrate;
after the removing, forming a redistribution structure over the top side of the sacrificial material, the redistribution structure including at least one redistribution layer, wherein the forming the redistribution structure includes:
forming a metal seed layer on the top surface; and
after forming the metal seed layer, forming a dielectric layer on the metal seed layer, patterning the dielectric layer to form a plurality of openings to expose the metal seed layer, and electroplating conductive material in the plurality of openings from the metal seed layer to at least partially fill the plurality of openings;
attaching a plurality of electronic components to the redistribution structure;
after the attaching, encapsulating the plurality of electronic components to form an encapsulated panel that includes the redistribution structure;
removing the first temporary substrate and the sacrificial material from the encapsulated panel after the encapsulating; and
singulating the encapsulated panel into a plurality of electronic component packages, each electronic component package of the plurality including at least one electronic component of the plurality of electronic components.

13. The method of claim 12 wherein the dielectric layer has a thickness in a range of 3-8 microns.

14. The method of claim 12, further comprising:
after the removing the first temporary substrate and the sacrificial material from the encapsulated panel, removing the metal seed layer, wherein after the patterning, the dielectric layer has a thickness, wherein after the singulating, at least a substantial portion of the thickness of the dielectric layer remains with each electronic component package of the plurality.

15. The method of claim 14 further comprising:
after removing the metal seed layer, attaching a plurality of solder balls to the encapsulated panel, wherein each electronic component package of the plurality of electronic component packages includes at least one solder ball of the plurality of solder balls, wherein each solder ball of the plurality of solder balls is electrically coupled to electroplated conductive material in an opening of the plurality of openings.

16. A method of making an electronic component package, the method comprising:
applying a sacrificial material to a first temporary substrate;
applying a second temporary substrate to a top side of the sacrificial material;
curing the sacrificial material while the second temporary substrate is applied to the top side;
after the curing, removing the second temporary substrate from the sacrificial material, wherein the top side has a top surface defined by the second temporary substrate and after the removing of the second temporary substrate, an unfeatured area of the top surface has a roughness (Ra) of 1 nm or less;
after the removing, forming a redistribution structure over the top side of the sacrificial material, the redistribution structure including at least one redistribution layer;
attaching a plurality of electronic components to the redistribution structure;
after the attaching, encapsulating the plurality of electronic components to form an encapsulated panel that includes the redistribution structure;
removing the first temporary substrate and the sacrificial material from the encapsulated panel after the encapsulating;
singulating the encapsulated panel into a plurality of electronic component packages, each electronic component package of the plurality including at least one electronic component of the plurality of electronic components.

17. A method of making an electronic component package, the method comprising:
applying a sacrificial material to a first glass carrier;
applying a second glass carrier to a top side of the sacrificial material;
curing the sacrificial material with UV radiation through the second glass carrier while the second glass carrier is applied to the top side;
after the curing, removing the second glass carrier from the sacrificial material, wherein the top side has a top surface defined by the second glass carrier, and wherein after the removing of the second glass carrier, an unfeatured area of the top surface has a roughness (Ra) of 1 nm or less;
after the removing, forming a redistribution structure over the top side of the sacrificial material, the redistribution structure including at least one redistribution layer;
attaching a plurality of electronic components to the redistribution structure;
after the attaching, encapsulating the plurality of electronic components to form an encapsulated panel that includes the redistribution structure;
removing the first glass carrier and the sacrificial material from the encapsulated panel after the encapsulating;
singulating the encapsulated panel into a plurality of electronic component packages, each electronic component package of the plurality of electronic component packages including at least one electronic component of the plurality of electronic components.

18. The method of claim 17 wherein prior to applying a sacrificial material to a first glass carrier, the method includes applying a layer of light to heat conversion adhesive to a first side of the first glass carrier, wherein the sacrificial material is applied on the layer of light to heat conversion adhesive.

* * * * *